(12) United States Patent
Yoo

(10) Patent No.: US 8,908,430 B2
(45) Date of Patent: Dec. 9, 2014

(54) SEMICONDUCTOR DEVICE AND METHOD OF OPERATING THE SAME

(75) Inventor: Byoung Sung Yoo, Seoul (KR)

(73) Assignee: SK Hynix Inc., Gyeonggi-do (JP)

( * ) Notice: Subject to any disclaimer, the term of this patent is extended or adjusted under 35 U.S.C. 154(b) by 211 days.

(21) Appl. No.: 13/553,161

(22) Filed: Jul. 19, 2012

(65) Prior Publication Data

US 2013/0021853 A1 Jan. 24, 2013

(30) Foreign Application Priority Data

Jul. 20, 2011 (KR) ........................ 10-2011-0071940

(51) Int. Cl.
G11C 11/34 (2006.01)
G11C 7/10 (2006.01)
G11C 16/06 (2006.01)
G11C 16/04 (2006.01)
G11C 16/34 (2006.01)

(52) U.S. Cl.
CPC ............ G11C 16/06 (2013.01); G11C 16/0483 (2013.01); G11C 16/3418 (2013.01)
USPC ............ 365/185.03; 365/185.11; 365/185.12; 365/189.05

(58) Field of Classification Search
CPC ...... G11C 7/1051; G11C 7/1078; G11C 7/22; G11C 7/106; G11C 7/1057
USPC ............ 365/189.05, 189.11, 185.19, 185.25, 365/185.03, 185.11, 185.12
See application file for complete search history.

(56) References Cited

U.S. PATENT DOCUMENTS

| | | | | |
|---|---|---|---|---|
| 6,353,555 | B1 * | 3/2002 | Jeong ........................ | 365/185.11 |
| 8,493,785 | B2 * | 7/2013 | Lee et al. ................... | 365/185.12 |
| 2005/0030790 | A1 * | 2/2005 | Jeong et al. .............. | 365/185.03 |
| 2012/0314506 | A1 * | 12/2012 | Baek et al. ................ | 365/185.25 |

FOREIGN PATENT DOCUMENTS

KR 2012-0136533 A 6/2011

* cited by examiner

Primary Examiner — Richard Elms
Assistant Examiner — Ajay Ojha
(74) Attorney, Agent, or Firm — William Park & Associates Patent Ltd.

(57) ABSTRACT

An embodiment of the present invention provides a semiconductor device, including cell string comprising a plurality of memory cells; page buffer comprising latch and switching element, wherein the switching element is coupled between the latch and the bit line which is coupled to the cell string; and a page buffer controller configured to apply a gradually rising turn-on voltage to the switching elements during a bit line setup operation of a program operation.

14 Claims, 5 Drawing Sheets

SEMICONDUCTOR DEVICE AND METHOD OF OPERATING THE SAME

CROSS-REFERENCE TO RELATED APPLICATION

Priority is claimed to Korean patent application number 10-2011-0071940 filed on Jul. 20, 2011, the entire disclosure of which is incorporated herein by reference in its entirety.

BACKGROUND

Embodiments of this invention relate generally to a semiconductor device and a method of operating the same, and more particularly to a semiconductor device for suppressing an increase in the peak current of bit lines during a program operation.

FIG. 1 is a block diagram illustrating an increase in the load of bit lines due to high integration of semiconductor devices.

Referring to FIG. 1, a semiconductor device includes a memory cell array 10 for storing data. The memory cell array 10 includes first to $k^{th}$ memory blocks MB1 to MBk. Each of the first to $k^{th}$ memory blocks MB1 to MBk includes a plurality of cell strings (not shown) each comprising a plurality of memory cells for storing data and coupled to respective bit lines BL.

High integration of semiconductor devices leads to an increase in the number of memory blocks in a memory chip and the number of cell strings in each memory block, and thus the load of the bit lines BL may increase. More particularly, an increase in the number of memory blocks MB1 to MBk forming a memory chip causes an increase in the length of each bit line BL. Furthermore, as the number of cell strings increases, the number of bit lines BL increases, and thus a load NBL increases. If a load of the bit lines BL increases as described above, a peak current of the bit lines BL may sharply rise when the semiconductor device is operated, e.g., when the bit lines BL is being precharged. A rise of the peak current is described in detail below with reference to FIG. 2.

FIG. 2 is a graph illustrating peak current due to the increase in the load of bit lines in FIG. 1.

Referring to FIG. 2, the peak current of the bit lines BL is in inverse proportion to the number of bit lines BL to be precharged. That is, the peak current of the bit lines BL is inversely proportional to the number of program data. More particularly, when voltages having different levels are applied to the bit lines BL, electrical charges due to capacitance is generated between adjacent bit lines BL. For example, at the early stage of a program operation, the number of bit lines BL to be precharged is relatively smaller than the number of bit lines BL to be discharged. Accordingly, when a small number of bit lines BL are precharged, a generation of electrical charges due to capacitance increases because a potential difference is generated owing to adjacent and discharged bit lines BL. Thus, a peak current of the precharged bit lines BL also rises. Accordingly, when the program operation is in the first stage, a peak current of the bit lines BL has a maximum value C1. As program operations proceed to later stages, the number of precharged bit lines BL increases because the number of programmed memory cells on which program has been completed is increased. Consequently, a peak current of the bit lines BL decreases as the number of programmed memory cells increases.

As described above, when a program operation is initially performed, a peak current rises because current due to capacitance between the bit lines BL increases. The increase in peak current may cause a power drop called surge power-down, and thus the semiconductor device may be abnormally operated.

BRIEF SUMMARY

An exemplary embodiment of the present invention relates to the suppression of a rise in the peak current of bit lines by controlling a turn-on voltage level at which a switching element for transferring a precharge voltage to the bit lines is turned on and a turn-on time that the switching element is taken to be turned on, when precharging the bit lines using page buffers.

An embodiment of the present invention provides a semiconductor device, including cell string comprising a plurality of memory cells; page buffer comprising latch and switching element, wherein the switching element is coupled between the latch and the bit line which is coupled to the cell string; and a page buffer controller configured to apply a gradually rising turn-on voltage to the switching element during a bit line setup operation of a program operation.

An embodiment of the present invention provides a method of operating a semiconductor device, including applying a program permission voltage or a program inhibition voltage to latch of page buffer coupled to bit line; setting up the bit line while applying a gradually rising turn-on voltage to gate of the switching element coupled between the bit line and the latch; and performing a program operation on cell string coupled to the bit line.

An embodiment of the present invention provides a method of operating a semiconductor device, including gradually increasing electric potential at a source of a switching element, coupled between bit line and latch included in page buffer coupled to cell strings through the bit line, by applying a gradually rising turn-on voltage to the switching element.

DESCRIPTION OF EMBODIMENTS

Hereinafter, some exemplary embodiments of the present invention will be described in detail with reference to the accompanying drawings. The figures are provided to allow those having ordinary skill in the art to understand the scope of the embodiments of the invention.

Figure 1:
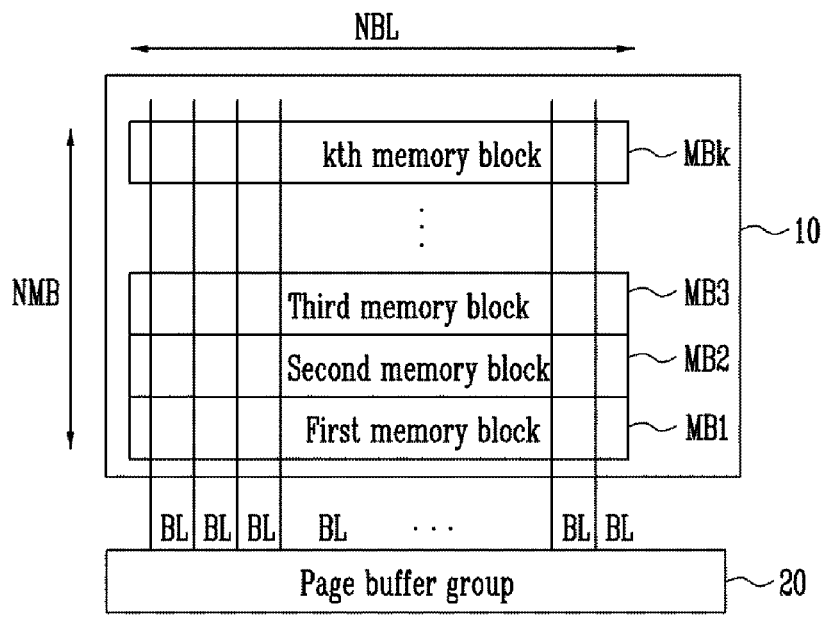
FIG. 1 is a block diagram illustrating an increase in the load of bit lines due to an increase in the degree of integration of semiconductor devices.
Figure 2:
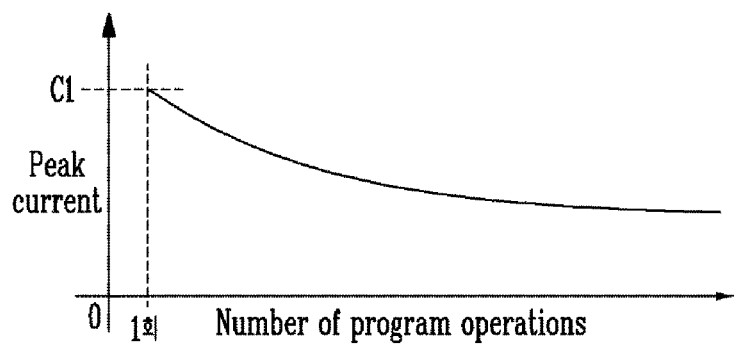
FIG. 2 is a graph illustrating peak current due to the increase in the load of bit lines in FIG. 1.
Figure 3:
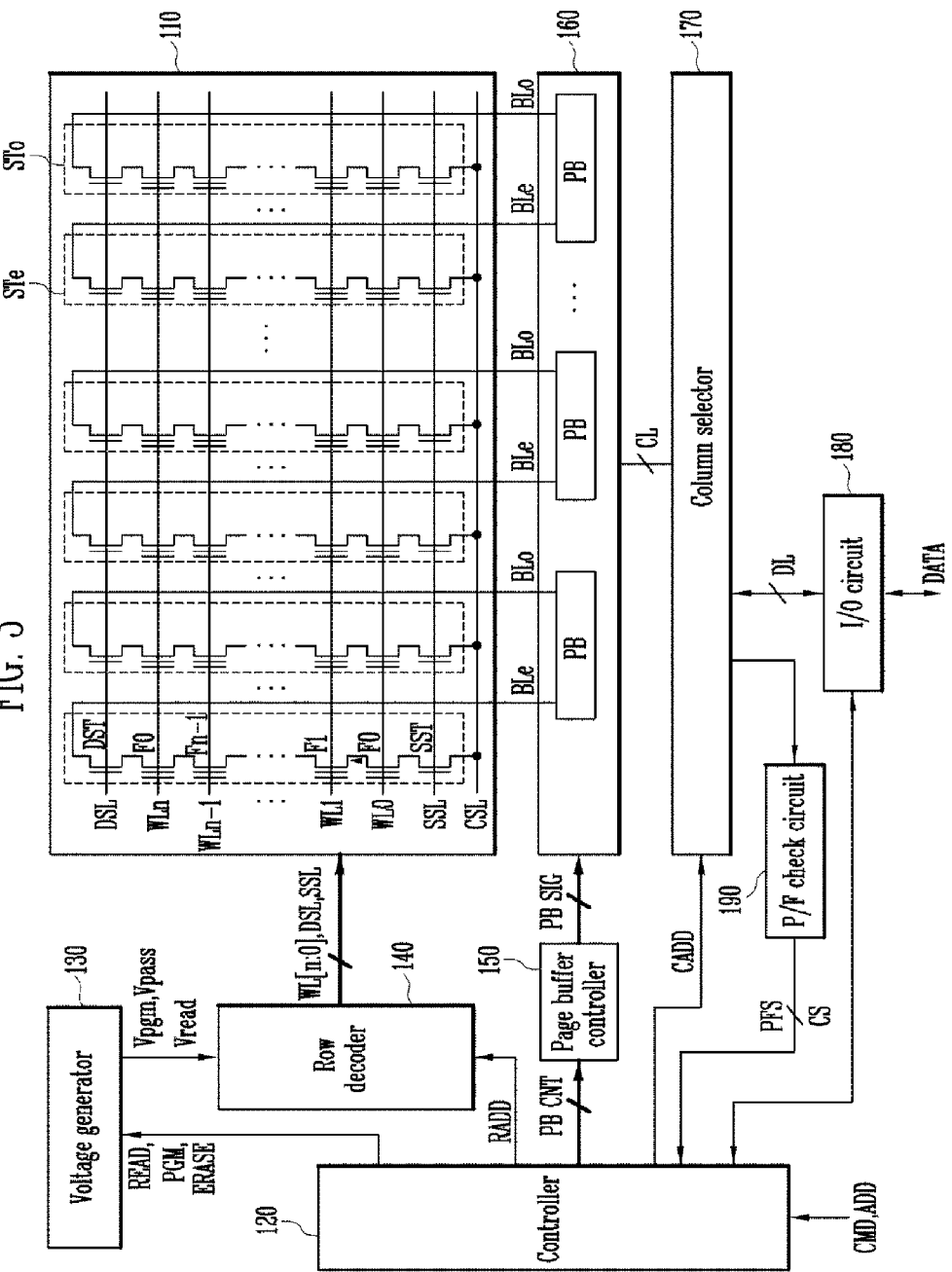
FIG. 3 is a block diagram of a semiconductor device according to an embodiment of the present invention.

FIG. 3 is a block diagram of a semiconductor device according to an embodiment of the present invention.

Referring to FIG. 3, the semiconductor memory device includes a memory cell array 110, a plurality of circuits 130, 140, 150, 160, 170, 180, and 190 configured to perform a program operation or a read operation on memory cells included in the memory cell array 110, and a controller 120 configured to control the plurality of circuits 130, 140, 150, 160, 170, 180, and 190 in order to set the threshold voltages of selected memory cells based on received data.

In case of a NAND flash memory device, the circuits include a voltage generator 130, a row decoder 140, a page buffer controller 150, a page buffer group 160, a column selector 170, an Input/Output (I/O) circuit 180, and a Pass/Fail (P/F) check circuit 190.

The memory cell array 110 may include a plurality of memory blocks. Only one of the memory blocks is shown in FIG. 3. Each of the memory blocks includes a plurality of cell strings STe and STo. Each cell string has a source select transistor SST, a plurality of memory cells F0 to Fn, and a drain select transistor DST. The gate of the source select transistor SST is coupled to a source select line SSL, the gates of the memory cells F0 to Fn are coupled to respective word lines WL0 to WLn, and the gate of the drain select transistor DST is coupled to a drain select line DSL. The cell strings STe and STo are coupled between respective bit lines BLe and BLo and a common source line CSL. Even-numbered bit lines of the bit lines BLe and BLo are called even bit lines BLe and odd-numbered bit lines thereof are called odd bit lines BLo according to their arrangements. Furthermore, cell strings coupled to the even bit lines BLe are called even strings STe, and cell strings coupled to the odd bit lines BLo are called odd strings STo.

The controller 120 may be configured to generate a program operation signal PGM, a read operation signal READ, or an erase operation signal ERASE in response to a command signal CMD and also generates a plurality of first page buffer control signals PB CNT for controlling the page buffer controller 150 according to the type of an operation. The controller 120 may be configured to generate a row address signal RADD and a column address signal CADD in response to an address signal ADD. Furthermore, the controller 120 may be configured to check whether the threshold voltages of selected memory cells have reached a target level in response to a count signal CS generated from the P/F check circuit 190 in a program or erase verify operation and determines whether to perform a program or erase operation again or not, i.e., determined whether the program or erase operation has been completed according to a result of check.

The voltage generator 130 may be configured to output various operating voltages for programming, reading, or erasing memory cells to global lines in response to operating signals PGM, READ, and ERASE, that is, the internal command signals of the controller 120. For example, when a programming operation is performed, the voltage generator 130 outputs operating voltages (e.g., Vpgm, Vpass, and Vread) for the programming operation to the global lines in response to the program operation signal PGM.

The row decoder 140 may be configured to transfer the operating voltages of the voltage generator 130 to the lines WL[n:0], DSL, and SSL of a selected memory block in response to the row address signals RADD of the controller 120.

The page buffer controller 150 may be configured to generate a plurality of second page buffer control signals PB SIG for controlling the page buffers PB of the page buffer group 160 in response to the first page buffer control signals PB CNT of the controller 120. The second page buffer control signals PB SIG include signals for controlling a plurality of switching elements included in each of the page buffers PB. In particular, the page buffer controller 150 controls a turn-on voltage of a switching element for coupling the bit lines BLe and BLo and the page buffer PB. More particularly, the page buffer controller 150 generates the plurality of second page buffer control signals PB SIG so that a low turn-on voltage is applied to the gate of the switching element for coupling the bit lines BLe and BLo and the page buffer PB and a turn-on voltage stepwise rising up to a target turn-on voltage is then applied to the switching element, when increasing the potentials of bit lines or precharging the bit lines, selected from among the even and odd bit lines BLe and BLo.

The page buffer group 160 may include the plurality of page buffers PB each coupled to a pair of the bit lines BLe and BLo and applies respective voltages necessary to store data in the memory cells F0 to Fn to the bit lines BLe and BLo in response to the second page buffer control signals PB SIG. More particularly, the page buffer group 160 precharges the bit lines BLe and BLo or latches data corresponding to the threshold voltages of the memory cells F0 to Fn, detected based on a change in the voltages of the bit lines BLe and BLo, in its latches when a program operation, an erase operation, or a read operation is performed on the memory cells F0 to Fn. In the program operation, for example, each of the page buffers PB applies a program permission voltage 0 V to the bit line BLe or BLo when a program data stored in the latch is '0' and a program inhibition voltage Vcc to the bit line BLe or BLo when a program data stored in the latch is '1', when a program operation is performed. Furthermore, the page buffer PB detects data stored in the memory cells F0 to Fn by controlling voltages of the bit lines BLe and BLo based on data stored in the memory cells F0 to Fn when a read operation is performed.

The column selector 170 may be configured to select a page buffer PB from the page buffer group 160 in response to the column address signal CADD of the controller 120. Data latched in the page buffer PB selected by the column selector 170 is outputted. Furthermore, the column selector 170 receives data from the page buffer group 160 through a column line CL and transfers the data to the P/F check circuit 190.

The I/O circuit 180 may be configured to transfer external data DATA to the column selector 170 under the control of the controller 120 in a program operation so that the data DATA is inputted to the page buffers PB of the page buffer group 160. When the column selector 170 sequentially transfers the external data DATA to the page buffers PB of the page buffer group 160, the page buffers PB store the data DATA in their latches. Furthermore, in a read operation, the I/O circuit 180 externally outputs data DATA received from the page buffers PB of the page buffer group 160 via the column selector 170.

The P/F check circuit 190 may be configured to check whether a failed cell has occurred in a verify operation subsequent to a program or erase operation and outputs a result of the checking operation as a check signal PFC. Furthermore, the P/F check circuit 190 may be configured to perform a function of counting the number of failed cells and outputting a result of the count in the form of the count signal CS.

Figure 4:
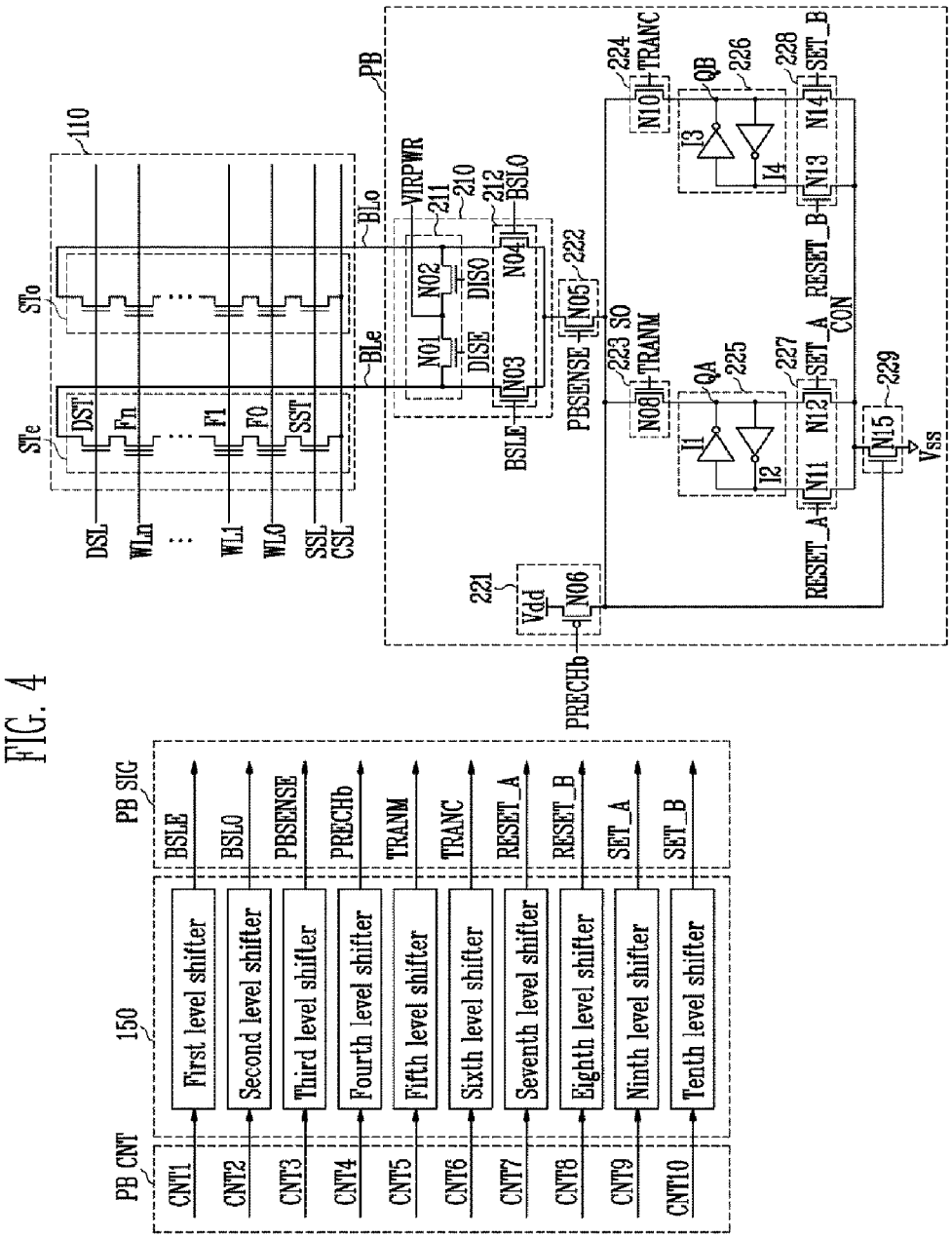
FIG. 4 is a detailed circuit diagram of a page buffer controller and a page buffer shown in FIG. 3.

FIG. 4 is a detailed circuit diagram of the page buffer controller 150 and one of the page buffers PB shown in FIG. 3.

Referring to FIG. 4, the page buffer controller 150 may include a plurality of level shifters. The number of level shifters may be equal to the number of switching elements to be controlled among switching elements included in the page buffer PB. It is to be noted that only a simple configuration of the page buffer PB is shown in FIG. 4, for ease of understanding, but the configuration of the page buffer PB may vary.

The page buffer PB is described in detail below with reference to FIG. 4.

The page buffer PB includes a Bit Line (BL) select circuit 210, a sense circuit 222, a precharge circuit 221, a first latch 225, a second latch 226, a first transfer circuit 223, a second transfer circuit 224, a first set/reset circuit 227, a second set/reset circuit 228, and a discharge circuit 229. The BL select circuit 210 may be configured to select any one of the bit lines BLe and BLo. The sense circuit 222 may be configured to transfer charges of a selected bit line to a sense node SO when a read operation is performed. The precharge circuit 221 may be configured to precharge the sense node SO. The first latch 225 and the second latch 226 may be configured to store data. The first transfer circuit 223 may be configured to transfer data, stored in the first latch 225, to the sense node SO. The second transfer circuit 224 may be configured to transfer data, stored in the second latch 226, to the sense node SO. The first and second set/reset circuits 227 and 228 may be configured to set or reset the first latch 225 and the second latch 226, respectively. The discharge circuit 229 may be configured to discharge a common node CON.

The BL select circuit 210 may include a BL precharge circuit 211 for precharging the even bit line BLe or the odd bit line BLo during a program operation and a select circuit 212 for selecting the even bit line BLe or the odd bit line BLo.

The BL precharge circuit 211 may include a first switching element N01 for precharging the even bit line BLe in response to an even precharge signal DISE and a second switching element N02 for precharging the odd bit line BLO in response to an odd precharge signal DISO. The first switching element N01 is formed of an NMOS transistor coupled between the even bit line BLe and a terminal for applying a virtual voltage VIRPWR. The second switching element N02 is formed of an NMOS transistor coupled between the odd bit line BLe and the terminal for applying the virtual voltage VIRPWR.

The select circuit 212 includes a third switching element N03 for selecting the even bit line BLe in response to an even select signal BSLE and a fourth switching element N04 for selecting the odd bit line BLo in response to an odd select signal BSLO. The third switching element N03 and the fourth switching element N04 may be formed of NMOS transistors.

The sense circuit 222 may include a fifth switching element N05 for coupling a selected bit line and the sense node SO in response to a sense signal PBSENSE. The fifth switching element N05 may be formed of an NMOS transistor.

The precharge circuit 221 may include a sixth switching element N06 for coupling the terminal of a power source voltage Vdd and the sense node SO in response to a precharge signal PRECHb in order to precharge the sense node SO. The sixth switching element N06 may be formed of a PMOS transistor.

The first latch 225 may include first and second inverters I1 and I2. The output terminal of the first inverter I1 is coupled to the input terminal of the second inverter I2, and the output terminal of the second inverter I2 is coupled to the input terminal of the first inverter I1.

The second latch 26 may include third and fourth inverters I3 and I4. The output terminal of the third inverter I3 is coupled to the input terminal of the fourth inverter I4, and the output terminal of the fourth inverter I4 is coupled to the input terminal of the third inverter I3. Although the page buffer PB of FIG. 5 illustrates only the two latches 225 and 226, the page buffer PB may include one latch. Also, the page buffer PB may include three or more latches.

The first transfer circuit 223 may include an eighth switching element N08 for coupling the output terminal of the first inverter I1 and the sense node SO in response to a first transfer signal TRANM. The eighth switching element N08 may be formed of an NMOS transistor.

The second transfer circuit 224 may include a tenth switching element N10 for coupling the output terminal of the third inverter I3 and the sense node SO in response to a second transfer signal TRANC. The tenth switching element N10 may be formed of an NMOS transistor.

The first set/reset circuit 227 may include an eleventh switching element N11 for coupling the output terminal of the second inverter I2 and the common node CON in response to a first reset signal RESET_A so that the first latch 225 is reset and a twelfth switching element N12 for coupling the input terminal of the second inverter I2 and the common node CON in response to a first set signal SET_A so that the first latch 225 is set. The eleventh and the twelfth switching elements N11 and N12 may be formed of NMOS transistors.

The second set/reset circuit 228 may include the thirteenth switching element N13 for coupling the output terminal of the fourth inverter I4 and the common node CON in response to a second reset signal RESET_B so that the first latch 226 is reset and a fourteenth switching element N14 for coupling the input terminal of the fourth inverter I4 and the common node CON in response to a second set signal SET_B so that the second latch 226 is set. The thirteenth and the fourteenth switching elements N13 and N14 may be formed of NMOS transistors.

The discharge circuit 229 may include a fifteenth switching element N15 for coupling the common node CON and a ground terminal Vss in response to voltage of the sense node SO so that the common node CON is discharged. The fifteenth switching element N15 may be formed of an NMOS transistor.

The page buffer controller 150 is described in detail below with reference to FIGS. 3 and 4.

The page buffer controller 150 may include first to tenth level shifters for generating the second page buffer control signals PB SIG in response to the first page buffer control signals PB CNT generated from the controller 120. Although the ten level shifters are illustrated in FIG. 4, more level shifters for controlling other switching elements included in the page buffer PB may be further included. The first page buffer control signals PB CNT form a group of signals CNT1 to CNT10 applied to the first to tenth level shifters, respectively. The second page buffer control signals PB SIG form a group of the signals BSLE, BSLO, PBSENSE, PRECHb, TRANM, TRANC, RESET_A, RESET_B, SET_A, and SET_B generated from the first to tenth level shifters. The level shifters generate respective output signals BSLE, BSLO, PBSENSE, PRECHb, TRANM, TRANC, RESET_A, RESET_B, SET_A and SET_B, having increased voltage levels, in response to the respective signals CNT1 to CNT10.

In particular, in an embodiment of the present invention, when the potentials of the bit lines BLe and BLo are raised or the bit lines BLe and BLo are precharged, the third level shifter generates the sense signal PBSENSE having a level lower than a target level and then gradually increases the level of the sense signal PBSENSE up to the target level. That is, the third level shifter controls the level and time of the sense signal PBSENSE in response to the third signal CNT3 of the controller 120. For example, in the state in which data '1' of a high level has been inputted to the first node QA of the first latch 225 and both the third switching element N03 and the eighth switching element N08 are turned on, when the level of the sense signal PBSENSE is gradually raised from a low level, the fifth switching element N05 is also gradually turned on. Thus, a sharp rise in the peak current of the selected bit lines BLe is inhibited because the potential of selected bit lines BLe are inhibited from suddenly rising. This may be expressed by Equation below.

$$i(BL) \approx C(BL) \times (dV/dt) \qquad \text{[Equation 1]}$$

Referring to Equation 1, i(BL) indicates current of bit lines, C(BL) indicates capacitance between the bit lines, dV indicates a change in a level of voltage applied to the bit lines, and dt indicates a change in the time when the voltage is applied to the bit lines. As can be seen from Equation 1, the current i(BL) is controlled by controlling the voltage level dV and the time dt because the capacitance between the bit lines cannot be changed. That is, in order to lower the level of voltage applied to the bit lines, the fifth switching element N05 is weakly turned on because the current i(BL) is proportional to a change in the level of voltage dV, but inversely proportional to a change in the time dt. To this end, as described above, the level of the sense signal PBSENSE applied to the gate of the fifth switching element N05 is controlled. Program operations of the semiconductor device are described below as examples.

Figure 5A:
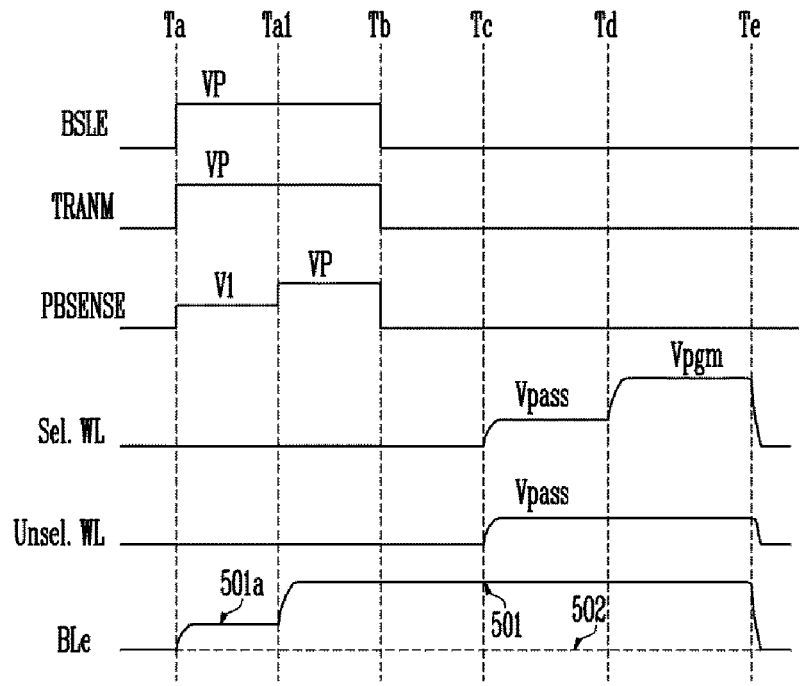
FIGS. 5A and 5B are timing diagrams illustrating program operations according to some exemplary embodiments of the present invention.
Figure 5B:
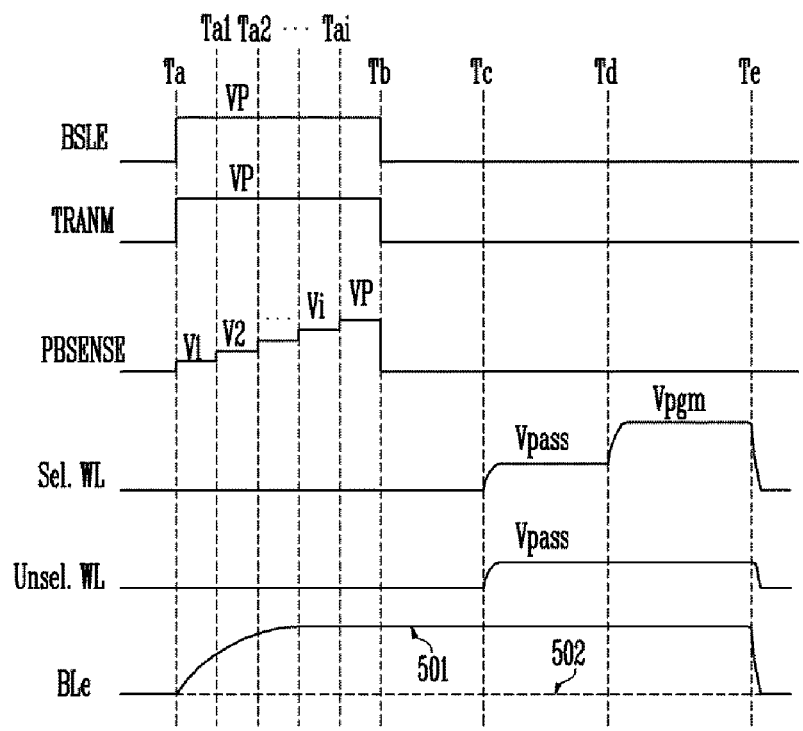

FIGS. 5A and 5B are timing diagrams illustrating program operations according to some exemplary embodiments of the present invention.

A program operation method according to an exemplary embodiment of the present invention is described below with reference to FIGS. 3, 4, and 5A.

Bit Line Setup Section (Ta-Tb)

When a program operation is started, data stored in the first latch 225 is transferred to bit lines in order to set up the potential of the bit lines. For example, data '1' or '0' is stored in the first latch 225. If data '1' is stored in the first latch 225, it means that the program inhibition voltage has been applied to the first node QA. If data '0' is stored in the first latch 225, it means that the program permission voltage Vcc has been applied to the first node QA. An embodiment of the present invention relates to a peak current when the program inhibition voltage is applied to bit lines, and thus the page buffer PB in which data '1' has been stored in the first latch 225 is described as an example. In order to couple the first node QA of the first latch 225 and a selected bit line (for example, BLe), the controller 120 enables the first, the third, and the fifth signals CNT1, CNT3 and CNT5. The first, the third, and the fifth level shifters of the page buffer controller 150 generate the even select signal BSLE, the sense signal PBSENSE, and the first transfer signal TRANM, respectively, in response to the first, the third, and the fifth signals CNT1, CNT3, and CNT5, respectively. In particular, the third level shifter generates the sense signal PBSENSE, having a level V1 lower than a target turn-on level VP, in response to the third signal CNT3 and increases the level of the sense signal PBSENSE up to the target turn-on level VP after a lapse of a specific time Ta1. For example, the sense signal PBSENSE may comprise a staircase waveform signal. Here, the sense signal PBSENSE having the level V1 lower than the target turn-on level VP is set to a level or higher at which at least the fifth switching element N05 may be turned on. The fifth switching element N05 is turned on in response to the sense signal PBSENSE having the level V1 lower than the target turn-on level VP, but is weakly turned on when receiving the sense signal PBSENSE having the target turn-on level VP. In other words, if the level of the sense signal PBSENSE applied to the gate of the fifth switching element N05 is low, the level of voltage at the source of the fifth switching element N05 does not rise no matter how the level of voltage at the drain of the fifth switching element N05 is high. Accordingly, since voltage 501*a* having a lower level than voltage 501 applied to target bit lines is applied to the selected bit line BLe, a phenomenon in which a peak current of the bit lines BLe sharply rises can be suppressed. Here, the potentials of bit lines coupled to a page buffer PB to which data '0' corresponding to the program permission voltage has been inputted to the first latch 225 do not rise owing to the program permission voltage (502).

Refresh Section (Tb-Tc)

During a refresh section, new program data is inputted to the first latch 225. Accordingly, during the refresh section, the potentials of the even select signal BSLE, the first transfer signal TRANM, and the sense signal PBSENSE should be lowered to a low level so that the potentials of the bit lines BLe are not changed.

Pass Voltage Apply Section (Tc-Td)

When a pass voltage apply section is started (Tc), the program pass voltage Vpass is applied to a selected word line Sel. WL and the remaining unselected word lines Unsel. WL. Although not shown in FIG. 5A, when the pass voltage apply section is started (Tc), the drain select transistor DST is turned on, and the source select transistor SST is turned off so that the potentials of the bit lines BLe and BLo are transferred to respective relevant cell strings.

Program Voltage Apply Section (Td-Te)

When a program voltage apply section is started (Td), the program voltage Vpgm is consecutively applied to the selected word line Sel. WL. That is, the potential of the selected word line Sel. WL to which the program pass voltage Vpass is applied is raised up to the level of the program voltage Vpgm. While the program voltage Vpgm is applied to the selected word line Sel. WL, the threshold voltages of memory cells coupled to bit lines to which the program permission voltage has been applied (502) rise, and the threshold voltages of memory cells coupled to the target bit lines to which the program inhibition voltage has been applied (501) do not rise. Selected memory cells can be programmed in this manner.

A program operation method according to an exemplary embodiment of the present invention is described below with reference to FIG. 5B.

Bit Line Setup Section (Ta-Tb)

When a program operation is started, data stored in the first latch 225 is transferred to bit lines in order to set up the potential of the bit lines. For example, data '1' or '0' is stored in the first latch 225. If data '1' is stored in the first latch 225, it means that the program inhibition voltage has been applied to the first node QA. If data '0' is stored in the first latch 225, it means that the program permission voltage Vcc has been applied to the first node QA. An embodiment of the present invention relates to a peak current when the program inhibition voltage is applied to bit lines, and thus the page buffer PB in which data '1' has been stored in the first latch 225 is described as an example. In order to couple the first node QA of the first latch 225 and a selected bit line (for example, BLe), the controller 120 enables the first, the third, and the fifth signals CNT1, CNT3 and CNT5. The first, the third, and the fifth level shifters of the page buffer controller 150 generate the even select signal BSLE, the sense signal PBSENSE, and the first transfer signal TRANM, respectively, in response to the first, the third, and the fifth signals CNT1, CNT3, and CNT5, respectively. In particular, the third level shifter generates the sense signal PBSENSE, having a level V1 lower than a target turn-on level VP, in response to the third signal CNT3 and then gradually increases the level of the sense signal PBSENSE up to the target turn-on level VP at specific time intervals Ta1, Ta2, . . . , Tai. For example, the sense signal PBSENSE may comprise a staircase waveform signal. Here, the lowest level V1 is set to a level or higher at which at least the fifth switching element N05 may be turned on. The fifth switching element N05 is turned on in response to the sense signal PBSENSE having the level V1 lower than the target turn-on level VP, but is weakly turned on when receiving the sense signal PBSENSE having the target turn-on level VP. In other words, if the level of the sense signal PBSENSE applied to the gate of the fifth switching element N05 is low, the level of voltage at the source of the fifth switching element N05 does not rise no matter how the level of voltage at the drain of the fifth switching element N05 is high. Accordingly, since voltage having a lower level than voltage 501 applied to target bit lines is gradually raised and applied to the selected bit line BLe, a phenomenon in which a peak current of the bit lines BLe sharply rises can be suppressed. Here, the potentials of bit lines coupled to a page buffer PB to which data '0' corresponding to the program permission voltage has been inputted to the first latch 225 do not rise owing to the program permission voltage (502).

Refresh Section (Tb-Tc)

During a refresh section, new program data is inputted to the first latch 225. Accordingly, during the refresh section, the potentials of the even select signal BSLE, the first transfer signal TRANM, and the sense signal PBSENSE should be lowered to a low level so that the potentials of the bit lines BLe are not changed.

Pass Voltage Apply Section (Tc-Td)

When a pass voltage apply section is started (Tc), the program pass voltage Vpass is applied to a selected word line Sel. WL and the remaining unselected word lines Unsel. WL. Although not shown in FIG. 5A, when the pass voltage apply section is started (Tc), the drain select transistor DST is turned on, and the source select transistor SST is turned off so that the potentials of the bit lines BLe and BLo are transferred to respective relevant cell strings.

Program Voltage Apply Section (Td-Te)

When a program voltage apply section is started (Td), the program voltage Vpgm is consecutively applied to the selected word line Sel. WL. That is, the potential of the selected word line Sel. WL to which the program pass voltage Vpass is applied is raised up to the level of the program voltage Vpgm. While the program voltage Vpgm is applied to the selected word line Sel. WL, the threshold voltages of memory cells coupled to bit lines to which the program permission voltage has been applied (502) rise, and the threshold voltages of memory cells coupled to the target bit lines to which the program inhibition voltage has been applied (501) do not rise. Selected memory cells can be programmed in this manner.

In the above embodiments of the present invention, a sharp rise in the peak current of bit lines has been suppressed by gradually increasing the level of the sense signal. In addition to the sense signal, a sharp rise in the peak current of bit lines may be suppressed by gradually increasing the level of the even select signal BSLE or the first transfer signal TRANM. That is, a semiconductor device including level shifters for gradually increasing the turn-on voltages of one or two or more of switching elements coupled between a latch and bit lines so that the turn-on voltages reach a target turn-on level may be configured.

Figure 6:
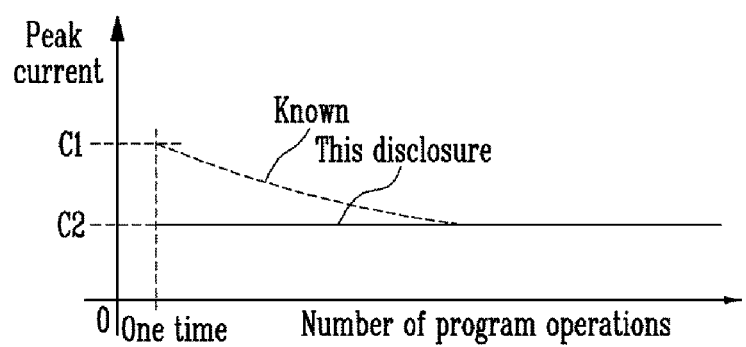
FIG. 6 is a graph illustrating effects according to an embodiment of the present invention.

FIG. 6 is a graph illustrating effects according to an embodiment of the present invention.

Referring to FIG. 6, when data stored in a latch are transferred to a bit line during a program operation, a low turn-on voltage is first applied to the gate of a switching element included in the latch. Next, the low turn-on voltage reaches a target turn-on voltage by gradually increasing the low turn-on voltage. In this case, the occurrence of a sudden peak current can be minimized although a load of bit lines is increased. At the early stage (one time) of a program operation, electrical charges due to capacitance between bit lines increases because the number of data '1' (corresponding to a program inhibition voltage) to be stored is greater than the number of data '0' (corresponding to a program permission voltage) to be stored in the latches of the page buffers. For this reason, in a known art, when the program inhibition voltage is applied to the bit lines, a peak current sharply rises (C1) because of the increased electrical charges due to capacitance. In an embodiment of the present invention, however, a peak current has a level C2 lower than the level C1 because the program inhibition voltage is applied to the bit lines while gradually increasing the level of the sense signal. In particular, if the level of the sense signal is subdivided and gradually raised, a peak current has, for example, the constant level C2 irrespective of the number of program operations. If a sharp rise of the peak current is minimized as described above, a sudden power drop called surge power-down can be suppressed. Accordingly, an abnormal operation of a semiconductor device, such as electrical deterioration, can be minimized.

In accordance with an embodiment of the present invention, when an operation of precharging bit lines is performed, a rise of a peak current can be suppressed. Accordingly, a sudden power drop of a semiconductor device can be minimized, and an abnormal operation of the semiconductor device due to the power drop can be suppressed.

What is claimed is:

1. A semiconductor device, comprising:
   a cell string comprising a plurality of memory cells;
   a page buffer, coupled to the cell string through a bit line, comprising a latch and switching elements, wherein some of the switching elements are coupled between the latch and the bit line; and
   a page buffer controller configured to selectively apply gradually rising turn-on voltages to the switching elements during a bit line setup operation of a program operation.

2. The semiconductor device of claim 1, wherein the turn-on voltages comprise staircase waveform signals.

3. The semiconductor device of claim 1, wherein the page buffer controller comprises level shifters for applying the turn-on voltages to gates of the switching elements.

4. The semiconductor device of claim 2, wherein the level shifters apply the turn-on voltages to the switching elements which are coupled between the latch and the bit line, wherein the turn-on voltages are lower than a target turn-on voltage in the beginning of the bit line setup operation of a program operation and then gradually increases up to the target turn-on voltage.

5. A method of operating a semiconductor device, comprising:
   applying a program permission voltage or a program inhibition voltage to a latch of page buffer;
   transferring the program permission voltage or the program inhibition voltage to the bit line by applying a gradually rising turn-on voltage to gate of a switching element coupled between the bit line and the latch; and
   applying a program pass voltage to unselected word lines, and a program voltage to a selected word line to program selected memory cells.

6. The method of claim 5, wherein the turn-on voltage comprises a staircase waveform signal.

7. The method of claim 5, wherein the program permission voltage is 0 V, and the program inhibition voltage is a power source voltage.

8. The method of claim 5, wherein the turn-on voltage is lower than a target turn-on voltage in the beginning of the bit line setup operation of a program operation and then gradually increases up to the target turn-on voltage.

9. The method of claim 8, wherein the transferring of the program permission voltage or the program inhibition voltage to the bit line is performed for a specific time.

10. The method of claim 9, wherein the turn-on voltage is gradually raised at constant time intervals within the specific time.

11. A method of operating a semiconductor device, comprising:
   gradually increasing electric potential at a source of a switching element, coupled between a bit line and a latch included in a page buffer coupled to cell strings through the bit line, by applying a gradually rising turn-on voltage to the switching element, before applying a program voltage to a selected word line.

12. The method of claim 11, wherein the turn-on voltage comprises a staircase waveform signal.

13. The method of claim 12, wherein the turn-on voltage is lower than a target turn-on voltage in the beginning of a bit line setup operation of a program operation and then gradually increases up to a target turn-on voltage.

14. The method of claim 11, wherein a power source voltage is applied to the latch which is coupled to a drain of the switching element in order to increase the electric potential of the source.

* * * * *